US006436833B1

(12) United States Patent
Pang et al.

(10) Patent No.: US 6,436,833 B1
(45) Date of Patent: Aug. 20, 2002

(54) METHOD FOR PRE-STI-CMP PLANARIZATION USING POLY-SI THERMAL OXIDATION

(75) Inventors: Chong Hau Pang; Chen Feng; Alex See; Peter Hing, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/805,953

(22) Filed: Mar. 15, 2001

(51) Int. Cl.$^7$ .............................................. H01L 21/00
(52) U.S. Cl. ........................... 438/692; 216/38; 216/88; 438/745; 438/756; 438/757
(58) Field of Search ................... 438/424, 425, 438/427, 692, 697, 719, 723, 745, 756, 757; 216/38, 79, 88, 99

(56) References Cited

U.S. PATENT DOCUMENTS

| | | | |
|---|---|---|---|
| 5,173,439 A | 12/1992 | Dash et al. | 437/67 |
| 5,721,173 A | 2/1998 | Yano et al. | 438/424 |
| 5,880,007 A | 3/1999 | Variam et al. | 438/427 |
| 6,001,706 A | 12/1999 | Tan et al. | 438/424 |
| 6,048,775 A | 4/2000 | Yao et al. | 438/427 |
| 6,107,159 A | 8/2000 | Chuang | 438/432 |

Primary Examiner—William A. Powell
(74) Attorney, Agent, or Firm—George O. Saile; Stephen B. Ackerman; Rosemary L. S. Pike

(57) ABSTRACT

A method of forming shallow trench isolations is described. An etch stop layer is deposited on the surface of a semiconductor substrate. A plurality of isolation trenches are etched through the etch stop layer into the semiconductor substrate to separate active areas. An oxide layer is deposited over the etch stop layer and within the isolation trenches wherein the oxide fills the isolation trenches and overlies the etch stop layer on the active areas. A polysilicon layer is deposited overlying the oxide layer within the isolation trenches and the oxide layer overlying the etch stop layer. The polysilicon layer is polished away until the oxide layer overlying the etch stop layer is exposed and the polysilicon layer remains only overlying the oxide layer in the isolation trenches. The polysilicon layer is oxidized whereby the oxidized polysilicon layer has a height close to the height of the oxide layer overlying the etch stop layer. The oxidized polysilicon layer, the oxide layer overlying the etch stop layer, and the oxide layer in the isolation trenches is polished down until the etch stop layer is reached thereby planarizing the isolation trenches to complete planarized shallow trench isolation regions in the manufacture of an integrated circuit device.

25 Claims, 4 Drawing Sheets

METHOD FOR PRE-STI-CMP PLANARIZATION USING POLY-SI THERMAL OXIDATION

BACKGROUND OF THE INVENTION

(1) Field of the Invention

The invention relates to a method of fabricating semiconductor structures, and more particularly, to a method of forming planarized shallow trench isolation structures in the manufacture of integrated circuit devices.

(2) Description of the Prior Art

Shallow trench isolation (STI) is now commonly used in the art as an alternative to local oxidation of silicon (LOCOS) for forming isolations between active device areas in the integrated circuit. STI offers the advantages of smaller isolation area and better surface planarization when compared to LOCOS. However, the STI process suffers from non-uniform planarization and dishing, especially over large trenches because of poor initial wafer topology. Dishing can cause excessive device leakage in some cases. Currently, reverse masking, dummy active structures, and more recently, nitride capping layers, are the most commonly employed methods to prevent dishing during the STI chemical mechanical polishing (CMP) process. However, reverse masking steps incur additional processing costs. Dummy structures, on the other hand, cause an increase in parasitic capacitance that is not favorable, especially in mixed signal processes. These processes are expensive and time-consuming.

Co-pending U.S. patent applications Ser. No. 09/439,357 to James Lee, filed on Nov. 11, 1999 now U.S. Pat. No. 6,197,691 issued on Mar. 6, 2001, and Ser. No. 09/803,187 to V. S. K. Lim et al, filed on Mar. 12, 2001 now Allowed, teach nitride capping techniques for preventing dishing in an STI process using HDP-CVD oxide. Several prior art approaches disclose methods to form and planarize shallow trench isolations. U.S. Pat. No. 5,173,439 to Dash et al teaches an STI process using a polysilicon layer to shield the oxide in wide trenches, etching away the oxide not covered by the polysilicon, and finally a CMP of the polysilicon and remaining oxide. U.S. Pat. No. 5,880,007 to Varian et al teaches a polysilicon layer over HDP oxide within trenches. CMP exposes the oxide, then the polysilicon and oxide are etched separately followed by an oxide CMP. U.S. Pat. No. 6,048,775 to Yao et al shows a process in which a silicon nitride capping layer is used. U.S. Pat. No. 5,721,173 to Yano et al uses a polysilicon capping process in which the polysilicon is subjected to CMP, the oxide not covered by the polysilicon is etched away, and the remaining polysilicon is polished by CMP. U.S. Pat. No. 6,001,706 to Tan et al and U.S. Pat. No. 6,107,159 to Chuang show other STI methods.

SUMMARY OF THE INVENTION

A principal object of the present invention is to provide an effective and very manufacturable method of fabricating shallow trench isolations in the manufacture of integrated circuits.

A further object of the present invention is to provide a method to fabricate shallow trench isolations where oxide dishing is eliminated.

Another object of the present invention is to provide a method to fabricate shallow trench isolations having better planarity control.

Yet another object of the invention is to provide a method to fabricate shallow trench isolations wherein oxide dishing is eliminated and better planarity control is achieved.

In accordance with the objects of this invention, a new method of forming shallow trench isolations has been achieved. An etch stop layer is deposited on the surface of a semiconductor substrate. A plurality of isolation trenches are etched through the etch stop layer into the semiconductor substrate to separate active areas. An oxide layer is deposited over the etch stop layer and within the isolation trenches wherein the oxide fills the isolation trenches and overlies the etch stop layer on the active areas. A polysilicon layer is deposited overlying the oxide layer within the isolation trenches and the oxide layer overlying the etch stop layer. The polysilicon layer is polished away until the oxide layer overlying the etch stop layer is exposed and the polysilicon layer remains only overlying the oxide layer in the isolation trenches. The polysilicon layer is oxidized whereby the oxidized polysilicon layer has a height close to the height of the oxide layer overlying the etch stop layer. The oxidized polysilicon layer, the oxide layer overlying the etch stop layer, and the oxide layer in the isolation trenches is polished down until the etch stop layer is reached thereby planarizing the isolation trenches to complete planarized shallow trench isolation regions in the manufacture of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
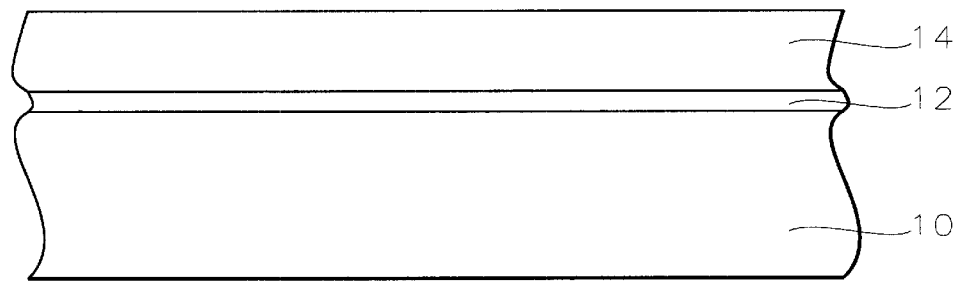
FIGS. 1 through 7 schematically illustrate in cross-sectional representation a preferred embodiment of the present invention.

Referring now more particularly to FIG. 1, there is shown a cross section of a partially completed integrated circuit device of the preferred embodiment. A semiconductor substrate 10, typically consisting of monocrystalline silicon, is provided. A pad oxide layer 12 is formed by oxidizing the silicon substrate surface. The pad oxide layer has a typical thickness of between about 50 and 200 Angstroms. An etch stop layer 14 is deposited over the pad oxide layer 12. The etch stop layer 14 is preferably composed of silicon nitride and is deposited by chemical vapor deposition (CVD) to a thickness of between about 1000 and 3000 Angstroms.

Figure 2:
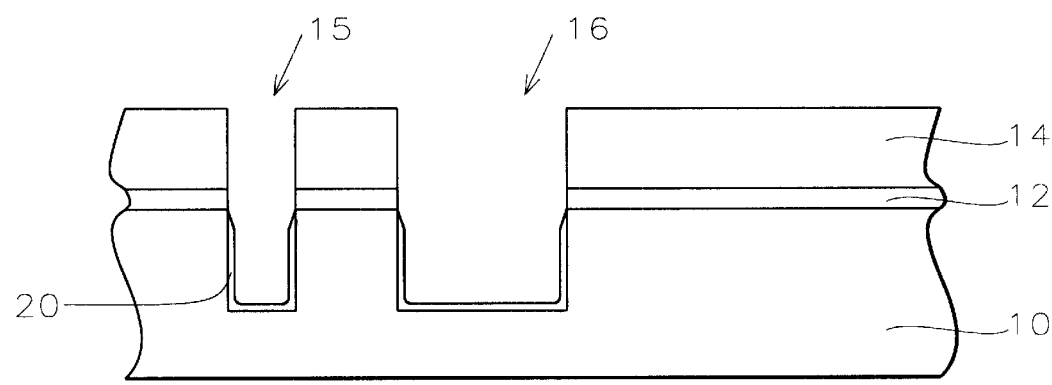

The etch stop layer 14, pad oxide layer 12, and the semiconductor substrate 10 are etched to form trenches 15 and 16 for planned shallow trench isolations. For example, a narrow trench 15 having a width of between about 0.2 and 5 $\mu$m and a wide trench 16 having a width of between about 5 and 100 $\mu$m are formed, as shown in FIG. 2. Optionally, an oxidation process forms a liner oxide 20 within the trenches 15 and 16.

Figure 3:
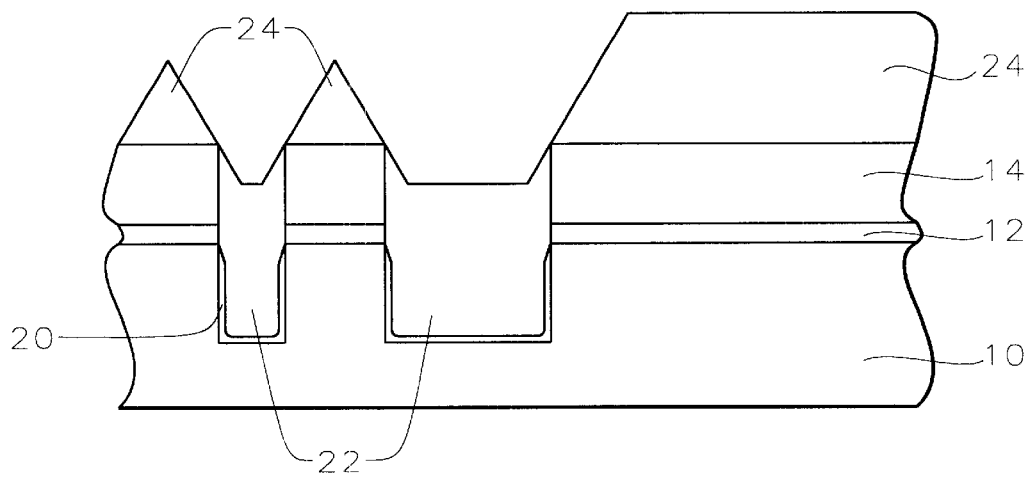

Referring now to FIG. 3, a gap fill layer is deposited within the trenches 15 and 16. Gap fill oxides include high density plasma (HDP) oxide, tetraethoxysilane (TEOS)—ozone ($O_3$) deposited by sub-atmospheric chemical vapor deposition (SACVD), borophosphosilicate glass (BPSG), TEOS oxide, or TEOS-$O_3$, for example, or any other dielectric layer that is able to fill the trench. The gap fill layer 22 fills the trenches and (24) covers the etch stop layer 14 overlying the active areas.

Figure 4:
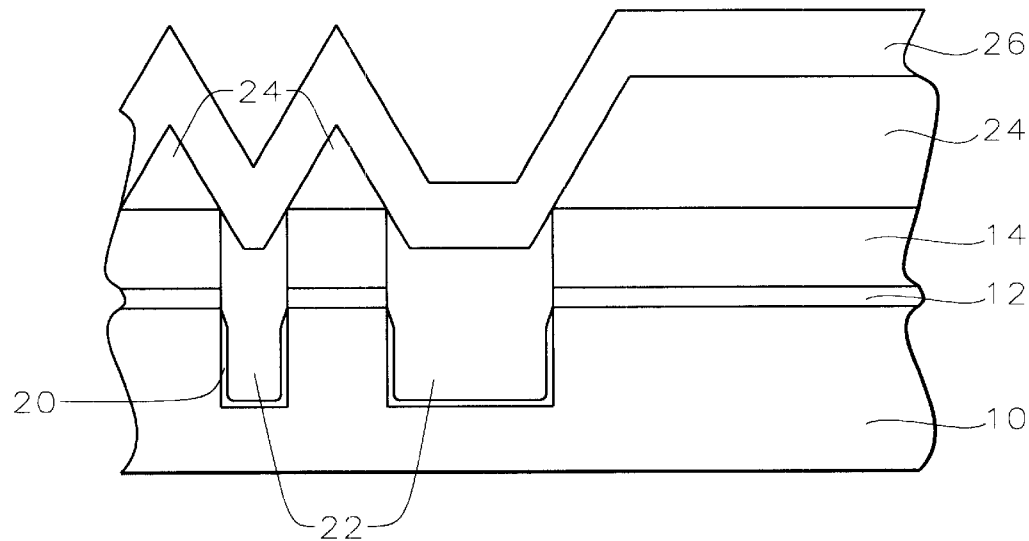

Referring now to FIG. 4, a layer of polysilicon 26 is deposited overlying the gap fill oxide 22/24. The polysilicon layer is deposited by low pressure CVD to a thickness of between about 2000 and 4000 Angstroms.

Figure 5:
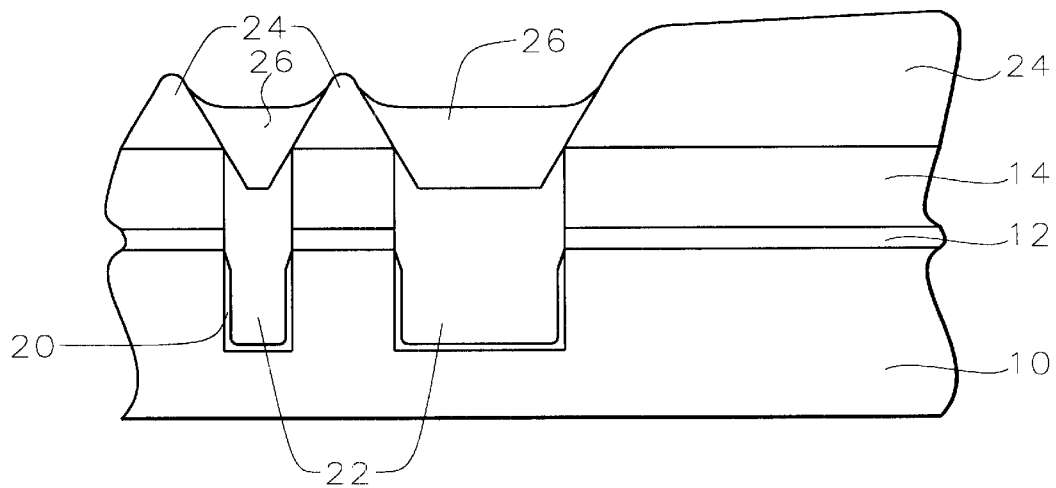
Figure 6:
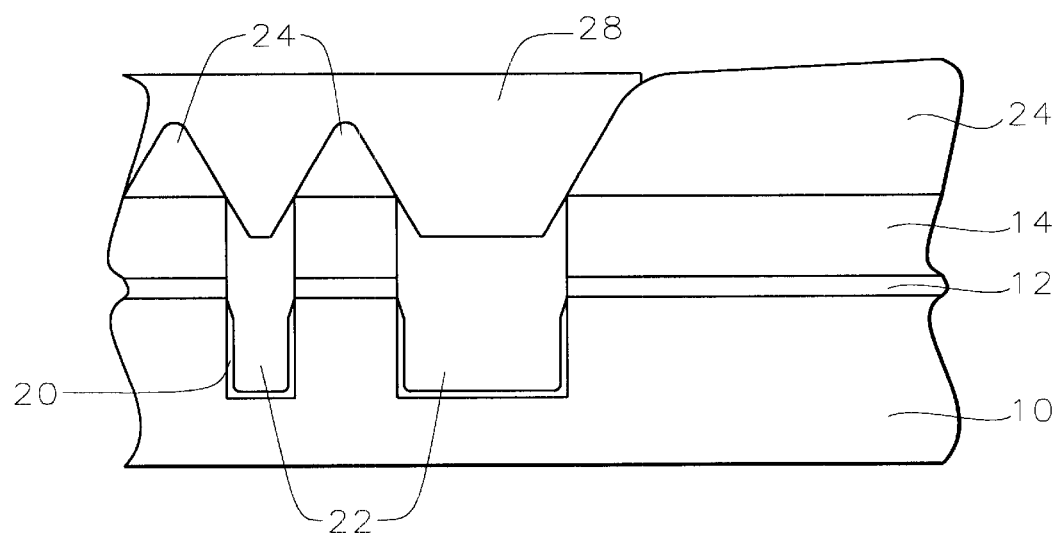

Referring now to FIG. 5, a chemical mechanical polishing (CMP) step is performed to remove the polysilicon layer 26 on top of the oxide peaks 24. The gap fill oxide 24 acts as a polish stop layer. Polysilicon 26 remains in the gaps between the oxide peaks 24.

Now, a thermal oxidation of the polysilicon 26 is performed. For example, the substrate is heated to a temperature of between about 800 and 1100° C. The oxidation reaction is as follows:

$$Si\ (s) + O_2(g) \rightarrow SiO_2\ (s)$$

or:

$$Si\ (s) + H_2O\ (g) \rightarrow SiO_2\ (s) + 2H\ (g)$$

The thickness of the silicon dioxide layer 28 will increase according to the formula:

$$t_{si} = 0.44\ t_{sio2},$$

where $t_{si}$=thickness of the (poly)silicon after CMP $t_{sio2}$=thickness of the SiO$_2$ after oxidation By controlling $t_{si}$, the final $t_{sio2}$ height can be determined. Hence, the SiO$_2$ thickness can grow to approximately the height of the highest oxide peaks 24. Oxidation is continued until a good planarization height is reached. A wet or dry oxidation may be used.

Figure 7:
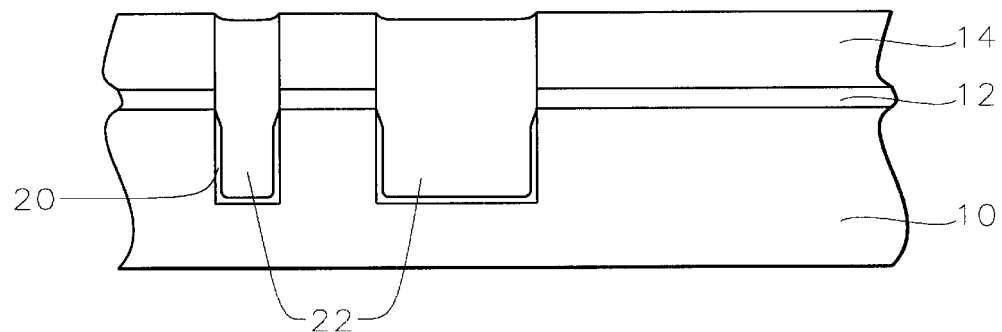

Finally, referring to FIG. 7, the oxide 28 and 24 is polished by CMP with a polish stop at the etch stop layer 14, completing formation of shallow trench isolation regions 22 having good planarity and no dishing. Alternatively, the oxide 28 and 24 can be planarized by an etching process. For example, for a CMP process, a polyurethane pad with or without a subpad may be used. A silica-based or potassium-based slurry may be used. The pad may have a down force of 3 to 7 psi and the table/head speed may be 30 to 100 rpm. For an etching process, a dry etch using an reactive ion etching (RIE) process or a wet etch using hydrofluoric acid (HF) may be used.

This completes fabrication of the shallow trench isolation regions. The shallow trench isolation has been formed without dishing and with good planarity control. No reverse mask, no dummy active areas, and no nitride cap has been used in this process. The thermal oxidation of polysilicon can be controlled so that excellent planarization can be achieved.

While the invention has been particularly shown and described with reference to the preferred embodiments thereof, it will be understood by those skilled in the art that various changes in form and details may be made without departing from the spirit and scope of the invention.

What is claimed is:

1. A method of forming shallow trench isolation regions in the manufacture of an integrated circuit device comprising:

depositing an etch stop layer on the surface of a semiconductor substrate;

etching a plurality of isolation trenches through said etch stop layer into said semiconductor substrate to separate active areas of said semiconductor substrate;

depositing an oxide layer over said etch stop layer and within said isolation trenches wherein said oxide layer fills said isolation trenches and overlies said etch stop layer on said active areas;

depositing a polysilicon layer overlying said oxide layer within said isolation trenches and said oxide layer overlying said etch stop layer;

polishing away said polysilicon layer until said oxide layer overlying said etch stop layer is exposed and said polysilicon layer remains only overlying said oxide layer in said isolation trenches;

thereafter oxidizing said polysilicon layer whereby oxidized said polysilicon layer has a height close to the height of said oxide layer overlying said etch stop layer; and polishing down said oxidized polysilicon layer, said oxide layer overlying said etch stop layer, and said oxide layer in said isolation trenches until said etch stop layer is reached thereby planarizing said isolation trenches to complete planarized said shallow trench isolation regions in said manufacture of said integrated circuit device.

2. The method according to claim 1 further comprising growing a pad oxide layer on said semiconductor substrate underlying said etch stop layer.

3. The method according to claim 1 wherein said etch stop layer comprises silicon nitride and is deposited by chemical vapor deposition to a thickness of between about 1000 and 3000 Angstroms.

4. The method according to claim 1 wherein said oxide layer is selected from the group consisting of: HDP-CVD oxide, TEOS oxide, TEOS-O$_3$, SACVD TEOS-O$_3$, and BPSG.

5. The method according to claim 1 wherein said polysilicon layer is deposited by low pressure chemical vapor deposition to a thickness of between about 2000 and 4000 Angstroms.

6. The method according to claim 1 wherein said step of polishing away said polysilicon layer comprises chemical mechanical polishing (CMP).

7. The method according to claim 1 wherein said step of oxidizing said polysilicon layer is a wet or dry oxidation.

8. The method according to claim 1 wherein said polishing down step comprises chemical mechanical polishing (CMP).

9. The method according to claim 1 wherein said polishing down step comprises wet or dry etching.

10. The method according to claim 1 further comprising fabricating semiconductor device structures in and on said semiconductor substrate between said isolation trenches.

11. A method of forming shallow trench isolation regions in the manufacture of an integrated circuit device comprising:

oxidizing the surface of a semiconductor substrate to form a pad oxide layer;

depositing a silicon nitride layer overlying said pad oxide layer;

etching a plurality of isolation trenches through said silicon nitride layer and said pad oxide layer into said semiconductor substrate to separate active areas of said semiconductor substrate;

depositing an oxide layer over said silicon nitride layer and within said isolation trenches wherein said oxide layer fills said isolation trenches and overlies said silicon nitride layer on said active areas;

depositing a polysilicon layer overlying said oxide layer within said isolation trenches and said oxide layer overlying said silicon nitride layer;

polishing away said polysilicon layer until said oxide layer overlying said silicon nitride layer is exposed and said polysilicon layer remains only overlying said oxide layer in said isolation trenches;

thereafter oxidizing said polysilicon layer whereby oxidized said polysilicon layer has a height close to the height of said oxide layer overlying said silicon nitride layer; and polishing down said oxidized polysilicon layer, said oxide layer overlying said silicon nitride layer, and said oxide layer in said isolation trenches until said silicon nitride layer is reached thereby planarizing said isolation trenches to complete planarized said shallow trench isolation regions in said manufacture of said integrated circuit device.

12. The method according to claim 11 wherein said silicon nitride layer has a thickness of between about 1000 and 3000 Angstroms.

13. The method according to claim 11 wherein said oxide layer is selected from the group consisting of: HDP-CVD oxide, TEOS oxide, TEOS-$O_3$, SACVD TEOS-$O_3$, and BPSG.

14. The method according to claim 11 wherein said polysilicon layer is deposited by low pressure chemical vapor deposition to a thickness of between about 2000 and 4000 Angstroms.

15. The method according to claim 11 wherein said step of polishing away said polysilicon layer comprises chemical mechanical polishing (CMP).

16. The method according to claim 11 wherein said step of oxidizing said polysilicon layer is a wet or dry oxidation.

17. The method according to claim 11 wherein said polishing down step comprises chemical mechanical polishing (CMP).

18. The method according to claim 11 wherein said polishing down step comprises wet or dry etching.

19. The method according to claim 11 further comprising fabricating semiconductor device structures in and on said semiconductor substrate between said isolation trenches.

20. A method of forming shallow trench isolation regions in the manufacture of an integrated circuit device comprising:

oxidizing the surface of a semiconductor substrate to form a pad oxide layer;

depositing a silicon nitride layer overlying said pad oxide layer;

etching a plurality of isolation trenches through said silicon nitride layer and said pad oxide layer into said semiconductor substrate to separate active areas of said semiconductor substrate wherein at least one narrow trench of less than 5 microns is formed and at least one wide trench of greater than 5 microns is formed;

depositing an oxide layer over said silicon nitride layer and within said isolation trenches wherein said oxide layer fills said isolation trenches and overlies said silicon nitride layer on said active areas;

depositing a polysilicon layer overlying said oxide layer within said isolation trenches and said oxide layer overlying said silicon nitride layer;

polishing away said polysilicon layer until said oxide layer overlying said silicon nitride layer is exposed and said polysilicon layer remains only overlying said oxide layer in said isolation trenches;

thereafter oxidizing said polysilicon layer whereby oxidized said polysilicon layer has a height close to the height of said oxide layer overlying said silicon nitride layer; and polishing down said oxidized polysilicon layer, said oxide layer overlying said silicon nitride layer, and said oxide layer in said isolation trenches until said silicon nitride layer is reached thereby planarizing said isolation trenches without dishing over said at least one wide trench to complete planarized said shallow trench isolation regions in said manufacture of said integrated circuit device.

21. The method according to claim 20 wherein said oxide layer is selected from the group consisting of: HDP-CVD oxide, TEOS oxide, TEOS-$O_3$, SACVD TEOS-$O_3$, and BPSG.

22. The method according to claim 20 wherein said polysilicon layer is deposited by low pressure chemical vapor deposition to a thickness of between about 2000 and 4000 Angstroms.

23. The method according to claim 20 wherein said step of polishing away said polysilicon layer comprises chemical mechanical polishing (CMP).

24. The method according to claim 20 wherein said step of oxidizing said polysilicon layer is a wet or dry oxidation.

25. The method according to claim 20 further comprising fabricating semiconductor device structures in and on said semiconductor substrate between said isolation trenches.

* * * * *